United States Patent
Rahman Khan et al.

(10) Patent No.: US 7,402,906 B2
(45) Date of Patent: Jul. 22, 2008

(54) ENHANCED DIE-DOWN BALL GRID ARRAY AND METHOD FOR MAKING THE SAME

(75) Inventors: Reza-ur Rahman Khan, Rancho Santa Margarita, CA (US); Sam Ziqun Zhao, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/891,519

(22) Filed: Jul. 15, 2004

(65) Prior Publication Data
US 2005/0012203 A1 Jan. 20, 2005

Related U.S. Application Data

(63) Continuation of application No. 09/783,034, filed on Feb. 15, 2001, now Pat. No. 6,853,070.

(51) Int. Cl.
*H01L 23/24* (2006.01)

(52) U.S. Cl. .................. 257/712; 257/713; 257/701; 257/704

(58) Field of Classification Search .......... 257/701, 257/706, 707, 712, 717, 733, 737; 438/122, 438/125, 613
See application file for complete search history.

(56) References Cited

U.S. PATENT DOCUMENTS

| | | |
|---|---|---|
| 3,790,866 A | 2/1974 | Meyer et al. |
| 4,611,238 A * | 9/1986 | Lewis et al. ............ 257/722 |
| 5,045,921 A | 9/1991 | Lin et al. |
| 5,065,281 A | 11/1991 | Hernandez et al. |
| 5,173,766 A | 12/1992 | Long et al. |
| 5,208,504 A | 5/1993 | Parker et al. |
| 5,216,278 A | 6/1993 | Lin et al. |
| 5,285,352 A | 2/1994 | Pastore et al. |

(Continued)

FOREIGN PATENT DOCUMENTS

EP 0 573 297 A2 12/1993

(Continued)

OTHER PUBLICATIONS

Ahn, S.H. and Kwon, Y.S., "Popcorn Phenomena in a Ball Grid Array Package", *IEEE Transactions on Components, Packaging, and Manufacturing Technology Part B: Advanced Packaging*, IEEE, Aug. 1995, vol. 18, No. 3, pp. 491-495.

(Continued)

*Primary Examiner*—Leonardo Andújar
(74) *Attorney, Agent, or Firm*—Sterne, Kessler, Goldstein & Fox PLLC

(57) ABSTRACT

An apparatus, system, and method for assembling a ball grid array (BGA) package is described. A stiffener/heat spreader is provided. A substrate has a first surface and a second surface. The substrate has a central window-shaped aperture that extends through the substrate from the first substrate surface to the second substrate surface. The first substrate surface is attached to a surface of the stiffener/heat spreader. A portion of the stiffener/heat spreader is accessible through the central window-shaped aperture. An IC die has a first surface and a second surface. The first IC die surface is mounted to the accessible portion of the stiffener/heat spreader. A drop-in heat spreader has a surface that is mounted to the second IC die surface.

34 Claims, 9 Drawing Sheets

U.S. PATENT DOCUMENTS

| | | | |
|---|---|---|---|
| 5,291,062 A | 3/1994 | Higgins, III | |
| 5,294,826 A | 3/1994 | Marcantonio et al. | |
| 5,366,589 A | 11/1994 | Chang | |
| 5,394,009 A | 2/1995 | Loo | |
| 5,397,917 A | 3/1995 | Ommen et al. | |
| 5,397,921 A | 3/1995 | Karnezos | |
| 5,409,865 A | 4/1995 | Karnezos | |
| 5,433,631 A | 7/1995 | Beaman et al. | |
| 5,438,216 A | 8/1995 | Juskey et al. | |
| 5,474,957 A | 12/1995 | Urushima | |
| 5,482,898 A * | 1/1996 | Marrs | 29/827 |
| 5,490,324 A | 2/1996 | Newman | |
| 5,534,467 A | 7/1996 | Rostoker | |
| 5,541,450 A | 7/1996 | Jones et al. | |
| 5,552,635 A | 9/1996 | Kim et al. | |
| 5,572,405 A | 11/1996 | Wilson et al. | |
| 5,578,869 A | 11/1996 | Hoffman et al. | |
| 5,583,377 A | 12/1996 | Higgins, III | |
| 5,583,378 A | 12/1996 | Marrs et al. | |
| 5,642,261 A | 6/1997 | Bond et al. | |
| 5,648,679 A | 7/1997 | Chillara et al. | |
| 5,650,659 A | 7/1997 | Mostafazadeh et al. | |
| 5,650,662 A | 7/1997 | Edwards et al. | |
| 5,691,567 A | 11/1997 | Lo et al. | |
| 5,717,252 A | 2/1998 | Nakashima et al. | |
| 5,736,785 A | 4/1998 | Chiang et al. | |
| 5,796,170 A | 8/1998 | Marcantonio | |
| 5,798,909 A | 8/1998 | Bhatt et al. | |
| 5,801,432 A | 9/1998 | Rostoker et al. | |
| 5,835,355 A | 11/1998 | Dordi | |
| 5,843,808 A | 12/1998 | Karnezos | |
| 5,844,168 A | 12/1998 | Schueller et al. | |
| 5,856,911 A | 1/1999 | Riley | |
| 5,866,949 A | 2/1999 | Schueller | |
| 5,883,430 A | 3/1999 | Johnson | |
| 5,889,321 A | 3/1999 | Culnane et al. | |
| 5,889,324 A | 3/1999 | Suzuki | |
| 5,894,410 A | 4/1999 | Barrow | |
| 5,895,967 A | 4/1999 | Stearns et al. | |
| 5,901,041 A | 5/1999 | Davies et al. | |
| 5,903,052 A | 5/1999 | Chen et al. | |
| 5,905,633 A | 5/1999 | Shim et al. | |
| 5,907,189 A | 5/1999 | Mertol | |
| 5,907,903 A | 6/1999 | Ameen et al. | |
| 5,920,117 A | 7/1999 | Sono et al. | |
| 5,949,137 A | 9/1999 | Domadia et al. | |
| 5,953,589 A | 9/1999 | Shim et al. | |
| 5,972,734 A | 10/1999 | Carichner et al. | |
| 5,977,626 A | 11/1999 | Wang et al. | |
| 5,977,633 A | 11/1999 | Suzuki et al. | |
| 5,982,621 A | 11/1999 | Li | |
| 5,986,340 A | 11/1999 | Mostafazadeh et al. | |
| 5,986,885 A | 11/1999 | Wyland | |
| 5,998,241 A | 12/1999 | Niwa | |
| 5,999,415 A | 12/1999 | Hamzehdoost | |
| 6,002,147 A | 12/1999 | Iovdalsky et al. | |
| 6,002,169 A | 12/1999 | Chia et al. | |
| 6,011,304 A | 1/2000 | Mertol | |
| 6,011,694 A | 1/2000 | Hirakawa | |
| 6,020,637 A | 2/2000 | Karnezos | |
| 6,028,358 A | 2/2000 | Suzuki | |
| 6,034,427 A | 3/2000 | Lan et al. | |
| 6,057,601 A | 5/2000 | Lau et al. | |
| 6,060,777 A | 5/2000 | Jamieson et al. | |
| 6,069,407 A | 5/2000 | Hamzehdoost | |
| 6,077,724 A | 6/2000 | Chen | |
| 6,084,297 A | 7/2000 | Brooks et al. | |
| 6,084,777 A | 7/2000 | Kalidas et al. | |
| 6,114,761 A | 9/2000 | Mertol et al. | |
| 6,117,797 A | 9/2000 | Hembree | |
| 6,122,171 A | 9/2000 | Akram et al. | |
| 6,133,064 A | 10/2000 | Nagarajan et al. | |
| 6,140,707 A | 10/2000 | Plepys et al. | |
| 6,159,764 A * | 12/2000 | Kinsman et al. | 438/106 |
| 6,160,705 A | 12/2000 | Stearns et al. | |
| 6,162,659 A | 12/2000 | Wu | |
| 6,163,458 A | 12/2000 | Li | |
| 6,166,434 A | 12/2000 | Desai et al. | |
| 6,184,580 B1 * | 2/2001 | Lin | 257/712 |
| 6,201,300 B1 | 3/2001 | Tseng et al. | |
| 6,207,467 B1 | 3/2001 | Vaiyapuri et al. | |
| 6,212,070 B1 | 4/2001 | Atwood et al. | |
| 6,242,279 B1 | 6/2001 | Ho et al. | |
| 6,246,111 B1 | 6/2001 | Huang et al. | |
| 6,278,613 B1 | 8/2001 | Fernandez et al. | |
| 6,288,444 B1 | 9/2001 | Abe et al. | |
| 6,313,521 B1 | 11/2001 | Baba | |
| 6,313,525 B1 | 11/2001 | Sasano | |
| 6,347,037 B2 | 2/2002 | Iijima et al. | |
| 6,362,525 B1 | 3/2002 | Rahim | |
| 6,369,455 B1 | 4/2002 | Ho et al. | |
| 6,380,623 B1 | 4/2002 | Demore | |
| 6,462,274 B1 | 10/2002 | Shim et al. | |
| 6,472,741 B1 | 10/2002 | Chen et al. | |
| 6,525,942 B2 | 2/2003 | Huang et al. | |
| 6,528,869 B1 | 3/2003 | Glenn et al. | |
| 6,528,892 B2 | 3/2003 | Caletka et al. | |
| 6,541,832 B2 | 4/2003 | Coyle | |
| 6,545,351 B1 | 4/2003 | Jamieson et al. | |
| 6,552,266 B2 | 4/2003 | Carden et al. | |
| 6,552,428 B1 | 4/2003 | Huang et al. | |
| 6,552,430 B1 | 4/2003 | Perez et al. | |
| 6,563,712 B2 | 5/2003 | Akram et al. | |
| 6,583,516 B2 | 6/2003 | Hashimoto | |
| 6,617,193 B1 | 9/2003 | Toshio et al. | |
| 6,664,617 B2 | 12/2003 | Siu | |
| 6,858,932 B2 * | 2/2005 | Gerber et al. | 257/712 |
| 2001/0001505 A1 | 5/2001 | Schueller et al. | |
| 2001/0045644 A1 | 11/2001 | Huang | |
| 2002/0053731 A1 | 5/2002 | Chao et al. | |
| 2002/0072214 A1 | 6/2002 | Yuzawa et al. | |
| 2002/0079562 A1 | 6/2002 | Zhao et al. | |
| 2002/0079572 A1 | 6/2002 | Khan et al. | |
| 2002/0096767 A1 | 7/2002 | Cote et al. | |
| 2002/0098617 A1 | 7/2002 | Lee et al. | |
| 2002/0109226 A1 | 8/2002 | Khan et al. | |
| 2002/0135065 A1 | 9/2002 | Zhao et al. | |
| 2002/0171144 A1 | 11/2002 | Zhang et al. | |
| 2002/0180040 A1 | 12/2002 | Camenforte et al. | |
| 2002/0185717 A1 | 12/2002 | Eghan et al. | |
| 2002/0185720 A1 | 12/2002 | Khan et al. | |
| 2002/0185722 A1 | 12/2002 | Zhao et al. | |
| 2002/0185734 A1 | 12/2002 | Zhao et al. | |
| 2002/0185750 A1 | 12/2002 | Khan et al. | |
| 2002/0190361 A1 | 12/2002 | Zhao et al. | |
| 2002/0190362 A1 | 12/2002 | Khan et al. | |
| 2003/0057550 A1 | 3/2003 | Zhao et al. | |
| 2003/0111726 A1 | 6/2003 | Khan et al. | |
| 2003/0138613 A1 | 7/2003 | Thoman et al. | |
| 2003/0146503 A1 | 8/2003 | Khan et al. | |
| 2003/0146506 A1 | 8/2003 | Khan et al. | |
| 2003/0146509 A1 | 8/2003 | Zhao et al. | |
| 2003/0146511 A1 | 8/2003 | Zhao et al. | |
| 2003/0179549 A1 | 9/2003 | Zhong et al. | |
| 2003/0179556 A1 | 9/2003 | Zhao et al. | |

FOREIGN PATENT DOCUMENTS

| | | |
|---|---|---|
| EP | 0 504 411 B1 | 6/1998 |
| FR | 2 803 098 A3 | 6/2001 |
| JP | 61-49446 A | 3/1986 |
| JP | 7-283336 A | 10/1995 |
| JP | 10-50877 A | 2/1998 |
| JP | 10-189835 A | 7/1998 |

| JP | 10-247702 A | 9/1998 |
| JP | 10-247703 A | 9/1998 |
| JP | 11-17064 A | 1/1999 |
| JP | 11-102989 A | 4/1999 |
| JP | 2000-286294 A | 10/2000 |
| JP | 2001-68512 A | 3/2001 |
| TW | 383908 | 3/2000 |
| TW | 417219 | 1/2001 |

OTHER PUBLICATIONS

Amkor Electronics, "Amkor BGA Packaging: Taking The World By Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International, Aug. 28-Sep. 1, 1994, San Jose, California, pp. 189-194.

Andrews, M., "Trends in Ball Grid Array Technology," *Ball Grid Array National Symposium*, Mar. 29-30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28-Sep. 1, 1994, San Jose, California, pp. 252-257.

Banerji, K., "Development of the Slightly Larger Than IC Carrier (SLICC)", *Journal of Surface Mount Technology*, Jul. 1994, pp. 21-26.

Bauer, C., Ph.D., "Partitioning and Die Selection Strategies for Cost Effective MCM Designs", *Journal of Surface Mount Technology*, Oct. 1994, pp. 4-9.

Bernier, W.E. et al., "BGA vs. QFP: A Summary of Tradeoffs for Selection of High I/O Components", *Surface Mount International Conference Proceedings*, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", *IEEE Transactions on Components, Packaging, and Manufacturing Technology Part A*, IEEE, Dec. 1995, vol. 18, No. 4, pp. 732-738.

Chadima, M., "Interconnecting Structure Manufacturing Technology," *Ball Grid Array National Symposium*, Dallas, Texas, Mar. 29-30, 1995, 12 pages.

Chanchani, R. et al., "Mini BGA: Pad and Pitch Ease Die Test and Handling", *Advance Packaging*, IHS Publishing Group, May/Jun. 1995, pp. 34 and 36-37.

Chung, T.C. et al., "Rework of Plastic, Ceramic, and Tape Ball Grid Array Assemblies", *Ball Grid Array National Symposium Proceedings*, Dallas, Texas, Mar. 29-30, 1995, pp. 1-15.

Cole, M.S. and Caulfield, T. "A Review of Available Ball Grid Array (BGA) Packages", *Journal of Surface Mount Technology*, Surface Mount Technology Association, Jan. 1996, vol. 9, pp. 4-11.

Cole, M.S. and Caulfield, T., "Ball Grid Array Packaging", *Surface Mount International Conference Proceedings*, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", *Advanced Packaging*, IHS Publishing Group, Sep./Oct. 1994, vol. 3, No. 5, pp. 28, 30 and 32.

Dody, G. and Burnette, T., "BGA Assembly Process and Rework", *Journal of Surface Mount Technology*, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", *45th Electronic Components & Technology Conference*, IEEE May 21-24, 1995, Las Vegas, NV, pp. 285-292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30-38.

English-language Abstract of JP 10-189835, published Jul. 21, 1998, 1 page, printed from http://v3.espacenet.com.

English-language Translation of JP 10-247702, published Sep. 14, 1998, 8 pages.

English-language Abstract of JP 10-247703, published Sep. 14, 1998, 1 page, printed from http://v3.espacenet.com.

English-language Abstract of JP 10-050877, published Feb. 20, 1998, 1 page, printed from http://v3.espacenet.com.

English-language Translation of JP 11-102989, published Apr. 14, 1999, 24 pages.

English-language Abstract of JP 11-017064, published Jan. 22, 1999, 1 page, printed from http://v3.espacenet.com.

English-language Abstract of JP 2000-286294, published Oct. 13, 2000, 1 page, printed from http://v3.espacenet.com.

English-language Abstract of JP 2001-068512, published Mar. 16, 2001, 1 page, printed from http://v3.espacenet.com.

English-language Abstract of JP 61-049446, published Mar. 11, 1986, 1 page, printed from http://v3.espacenet.com.

English-language Abstract of JP 7-283336, published Oct. 27, 1995, 1 page, printed from http://v3.espacenet.com.

Ewanich, J. et al., "Development of a Tab (TCP) Ball Grid Array Package", *Proceedings of the 1995 International Electronics Packaging Conference*, San Diego, CA, Sep. 24-27, 1995, pp. 588-594.

Fauser, S. et al, "High Pin-Count PBGA Assembly", *Circuits Assembly*. Feb. 1995, vol. 6, No. 2, pp. 36-38 and 40.

Fauser, Suzanne et al., "High Pin Count PBGA Assembly: Solder Defect Failure Modes and Root Cause Analysis", *Surface Mount International, Proceedings of The Technical Program*, Surface Mount International, Aug. 28-Sep. 1, 1994, San Jose, California, pp. 169-174.

Ferguson, M. "Ensuring High-Yield BGA Assembly", *Circuits Assembly*, Feb. 1995, vol. 6, No. 2, pp. 54, 56 and 58.

Freda, M., "Laminate Technology for IC Packaging", *Electronic Packaging & Production*, Cahners Publishing Company, Oct. 1995, vol. 35, No. 11, pp. S4-S5.

Freedman, M., "Package Size and Pin-Out Standardization", *Ball Grid Array National Symposium*, Mar. 29-30, 1995, 6 pages.

Freyman, B. and Pennisi, R., "Overmolded Plastic Pad Array Carriers (OMPAC): A Low Cost, High Interconnect Density IC Packaging Solution for Consumer and Industrial Electronics", *41st Electronic Components & Technology Conference*, IEEE, May 11-16, 1991, pp. 176-182.

Freyman, B. et al., "Surface Mount Process Technology for Ball Grid Array Packaging", *Surface Mount International Conference Proceedings*, Surface Mount International, Aug. 29-Sep. 2, 1993, San Jose, California, pp. 81-85.

Freyman, B. et al., "The Move to Perimeter Plastic BGAs", *Surface Mount International Conference Proceedings*, San Jose, CA Aug. 29-31, 1995, pp. 373-382.

Freyman, B., "Trends in Plastic BGA Packaging," *Ball Grid Array National Symposium*, Dallas, Texas, Mar. 29-30, 1995, 44 pages.

Gilleo, K., "Electronic Polymers: Die Attach and Oriented Z-Axis Films", *Advanced Packaging*, IHS Publishing Group, Sep./Oct. 1994, vol. 3, No. 5, pp. 37-38, 40 and 42.

Guenin, B. et al., "Analysis of a Thermally Enhanced Ball Grid Array Package", *IEEE Transactions on Components, Packaging, and Manufacturing Technology, Part A*, IEEE Components, Packaging, and Manufacturing Technology Society, Dec. 1995, vol. 18, No. 4, pp. 749-757.

Hart, C. "Vias in Pads", *Circuits Assembly*, Feb. 1995, vol. 5, No. 2, pp. 42, 44-46 and 50.

Hart, C., "Vias in Pads for Coarse and Fine Pitch Ball Grid Arrays", *Surface Mount International Conference Proceedings*, Surface Mount International, Aug. 28-Sep. 1, 1994, San Jose, California, pp. 203-207.

Hattas, D., "BGAs Face Production Testing: New Package Offers Promise but Must Clear Technology Hurdles.", *Advanced Packaging*, IHS Publishing Group, Summer 1993, vol. 2, No. 3, pp. 44-46.

Hayden, T.F. et al., "Thermal & Electrical Performance and Reliability Results for Cavity-Up Enhanced BGAs", *Electronic Components and Technology Conference*, IEEE, 1999, pp. 638-644.

Heitmann, R. "A Direct Attach Evolution: TAB, COB and Flip Chip Assembly Challenges", *Advanced Packaging*, IHS Publishing Group, Jul./Aug. 1994, vol. 3, No. 4, pp. 95-99.

Hodson, T., "Study Examines BGA Use", *Electronic Packaging & Production*, Mar. 1993, page unknown.

Holden, H., "The Many Techniques of Small Via Formation for Thin Boards", *The Institute for Interconnecting and Packaging Electronic Circuits Ball Grid Array National Symposium*, San Diego, CA, Jan. 18-19, 1996, pp. 1-7.

Houghten, J., "New Package Takes On QFPs", *Advanced Packaging*, IHS Publishing Group, Winter 1993, vol. 2, No. 1, pp. 38-39.

Houghten, J.L., "Plastic Ball-Grid Arrays Continue To Evolve", *Electronic Design*, Feb. 6, 1995, pp. 141-146.

"How To Give Your BGAs A Better Bottom Line.", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26-Mar. 2, 1995, Anaheim, California, pp. 300-307

Hundt, M. et al., "Thermal Enhancements of Ball Grid Arrays", *National Electronic Packaging and Production Conference West '95*, Reed Exhibition Companies, Anaheim, CA, Feb. 25-29, 1996, pp. 702-711.

Hutchins, C.L., "Understanding Grid Array Packages", *Surface Mount Technology Magazine*, IHS Publishing Group, Nov. 1994, vol. 8, No. 11, pp. 12-13.

Hwang, J.S., "A Hybrid of QFP and BGA Architectures", *Surface Mount Technology Magazine*, IHS Publishing Group, Feb. 1995, vol. 9, No. 2, p. 18.

Hwang, J.S., "Reliability of BGA Solder Interconnections", *Surface Mount Technology Magazine*, IHS Publishing Group, Sep. 1994, vol. 8, No. 9, pp. 14-15.

Johnson, R. et al., "A Feasibility Study of of Ball Grid Array Packaging", *National Electronic Packaging and Production Conference East '93*, Boston, Massachusetts, Jun. 14-17, 1993, pp. 413-422.

Johnson, R. et al., "Thermal Characterization of 140 and 225 Pin Ball Grid Array Packages", *National Electronic Packaging & Production Conference East '93*, Boston, Massachusetts, Jun. 14-17, 1993, pp. 423-430.

Johnston, P. "Printed Circuit Board Design Guidelines for Ball Grid Array Packages", *Journal of Surface Mount Technology*, Surface Mount Technology Association, Jan. 1996, vol. 9, pp. 12-18.

Johnston, P., "Land Pattern Interconnectivity Schemes", *Ball Grid Array Natinal Symposium*, Dallas, Texas, Mar. 29-30, 1995, pp. 2-21.

Karnezos, M., "An EPBGA Alternative," *Advanced Packaging*, Jun. 1998, pp. 90, 92, 94, and 96.

Kawahara, T. et al., "Ball Grid Array Type Package By Using of New Encapsulation Method", *Proceedings of the 1995 International Electronics Packaging Conference*, San Diego, CA, Sep. 24-27, 1995, pp. 577-587.

Knickerbocker, J.U. and Cole, M.S., "Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", *National Electronic Packaging and Production Conference West '95*, IEEE, Feb. 26-Mar. 2, 1995, Anaheim, California, pp. 1523-1529.

Kunkle, R., "Discrete Wiring for Array Packages", *Ball Grid Array National Symposium*, Dallas, Texas, Mar. 29-30, 1995, 9 pages.

Lall, B. et al, "Methodology for Thermal Evaluation of Multichip Modules", *IEEE Transactions on Components, Packaging, and Manufacturing Technology Part A*, IEEE, Dec. 1995, vol. 18, No. 4, pp. 758-764.

Lasance, C. et al., "Thermal Characterization of Electronic Devices with Boundary Condition Independent Compact Models", *IEEE Transactions on Components, Packaging, and Manufacturing Technology Part A*, IEEE Components, Packaging, and Manufacturing Technology Society, Dec. 1995, vol. 18, No. 4, pp. 723-731.

Lau, J. et al., "No Clean Mass Reflow of Large Plastic Ball Grid Array Packages", *Circuit World*, Wela Publications Ltd., vol. 20, No. 3, Mar. 1994, pp. 15-22.

Lau, J., *Ball Grid Array Technology*, McGraw-Hill Inc., 1995, entire book submitted.

"Literature Review", Special Supplement to *Electronic Packaging & Production*, Feb. 1995, Cahners Publication, 10 pages.

*LSI Logic Package Selector Guide, Second Edition*, LSI Logic Corporation, 1994-1995, entire document submitted.

"LTCC MCMs Lead to Ceramic BGAs," *Advanced Packaging*, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", *Journal of Surface Mount Technology*, Surface Mount International, Oct. 1994, pp. 33-41.

Marrs, R. et al., "Recent Technology Breakthroughs Achieved with the New SuperBGA® Package", *1995 International Electronics Packaging Conference*, San Diego, California, Sep. 24-27, 1995, pp. 565-576.

Marrs, R.C. and Olachea, G., "BGAs For MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip-Sized Package", *Advanced Packaging*, IHS Publishing Group, Jul./Aug. 1994, pp. 91-94.

Mawer, A. et al., "Plastic BGA Solder Joint Reliability Considerations", *Surface Mount International Conference Proceedings*, Surface Mount International, Aug. 28-Sep. 1, 1994, San Jose, California, pp. 239-251.

Mazzullo, T. and Schaerti, L., "How IC Packages Affect PCB Design", *Surface Mount Technology Magazine*, Feb. 1995, vol. 9, No. 2, pp. 114-116.

Mearig, J., "An Overview of Manufacturing BGA Technology", *National Electronic Packaging and Production Conference West '95*, Feb. 26-Mar. 2, 1995, Anaheim, California, pp. 295-299.

Mertol, A., "Application of the Taguchi Method on the Robust Design of Molded 225 Plastic Ball Grid Array Packages", *IEEE Transactions on Components, Packaging, and Manufacturing Technology Part B: Advanced Packaging*, IEEE, Nov. 1995, vol. 18, No. 4, pp. 734-743.

Mescher, P. and Phelan, G., "A Practical Comparison of Surface Mount Assembly for Ball Grid Array Components", *Surface Mount International Conference Proceedings*, Surface Mount International, Aug. 28-Sep. 1, 1994, San Jose, California, pp. 164-168.

Mulganoker, S. et al., "An Assessment of the Thermal Performance of the PBGA Family", *Eleventh Annual IEEE Semiconductor Thermal Measurement and Management Symposium*, IEEE, San Jose, CA, Feb. 7-9, 1995, pp. 17-27.

"New PBGA Pushes Technology to Outer Limits", *Advanced Packaging*, HIS Publishing Group, Jan./Feb. 1995, p. 11.

Olachea, G., "Managing Heat: A Focus on Power IC Packaging", *Electronic Packaging & Production (Special Supplement)*, Cahners Publishing Company, Nov. 1994, pp. 26-28.

"Pad Array Improves Density", *Electronic Packaging & Production*, Cahners Publishing Company, May 1992, pp. 25-26.

Patridge, J. and Viswanadham, P., "Organic Carrier Requirements for Flip Chip Assemblies", *Journal of Surface Mount Technology*, Surface Mount Technology Association, Jul. 1994, pp. 15-20.

Ramirez, C. and Fauser, S., "Fatigue Life Comparison of The Perimeter and Full Plastic Ball Grid Array", *Surface Mount International Conference Proceedings*, Surface Mount International, Aug. 28-Sep. 1, 1994, San Jose, California, pp. 258-266.

Rogren, P., "MCM-L Built on Ball Grid Array Formats", *National Electronic Packaging and Production Conference West '94*, Feb. 27-Mar. 4, 1994, Anaheim, California, pp. 1277-1282.

Rooks, S., "X-Ray Inspection of Flip Chip Attach Using Digital Tomosynthesis", *Surface Mount International Proceedings of The Technical Program*, Aug. 28-Sep. 1, 1994, San Jose, California, pp. 195-202.

Rukavina, J., "Attachment Methodologies: Ball Grid Array Technology", *Ball Grid Array National Symposium*, Dallas, Texas, Mar. 29-30, 1995, 36 pages.

Sack, T., "Inspection Technology", *Ball Grid Array National Symposium*, Dallas, Texas, Mar. 29-30, 1995, pp. 1-41.

Sakaguchi, H., "BGA Mounting Technology," pp. 1-4, date and source unknown.

Schmolze, C. and Fraser, A., "SPICE Modeling Helps Enhance BGA Performance", *Electronic Packaging & Production*, Jan. 1995, pp. 50-52.

Schueller, R.D. et al., "Performance and Reliability of a Cavity Down Tape BGA Package," *IEEE Electronic Packaging Technology Conference*, 1997, pp. 151-162.

*Semiconductor Group Package Outlines Reference Guide*, Texas Instruments, 1995, entire document submitted.

Shimizu, J., "Plastic Ball Grid Array Coplanrity", *Surface Mount Internatinal Conference*, San Jose, California, Aug. 31-Sep. 2, 1993, pp. 86-91.

Sigliano, R., "Using BGA Packages: An Appealing Technology in a QFP and Fine-Pitch Market", *Advanced Packaging*, IHS Publishing Group, Mar./Apr. 1994, pp. 36-39.

Sirois, L., "Dispensing for BGA: Automated Liquid Dispensing in a High-Density Environment", *Advanced Packaging*, IHS Publishing Group, May/Jun. 1995, pp. 38 and 41.

Solberg, V., "Interconnection Structure Preparation: Impact of Material Handling and PCB Surface Finish on SMT Assembly Process Yield", *Ball Grid Array National Symposium*, Dallas Texas, Mar. 29-30, 1995, 9 pages.

"Survival of the Fittest", *Advanced Packaging*, IHS Publishing Group, Mar./Apr. 1995, page unknown.

Thompson, T., "Reliability Assessment of a Thin (Flex) BGA Using a Polyimide Tape Substrate", *International Electronics Manufacturing Technology Symposium*, IEEE, 1999, pp. 207-213.

Tuck, J., "BGA Technology Branches Out", *Circuits Assembly*, Feb. 1995, vol. 6, No. 2, pp. 24, 26, and 28.

"Tutorial and Short Courses", *45th Electronic Components & Technology Conference*, May 21-24, 1995, Las Vegas, Nevada, IEEE, 4 pages.

Vardaman, E. J. and Crowley, R.T., "Worldwide Trends In Ball Grid Array Developments", *National Electronic Packaging and Production Conference West '96*, Reed Exhibition Companies, Anaheim, CA, Feb. 25-29, 1996, pp. 699-701.

Walshak, D. and Hashemi, H., "BGA Technology: Current and Future Direction for Plastic, Ceramic and Tape BGAs", *Surface Mount International Conference Proceedings*, Surface Mount International, Aug. 28-Sep. 1, 1994, San Jose, California, pp. 157-163.

Walshak, D. and Hashemi, H., "Thermal Modeling of a Multichip BGA Package", *National Electronic Packaging and Production Conference West '94*, Reed Exhibition Companies, Anaheim, California, Feb. 27-Mar. 4, 1994, pp. 1266-1276.

Xie, H. et al., "Thermal Solutions to Pentium Processors in TCP in Notebooks and Sub-Notebooks", *45th Electronic Components & Technology Conference*, IEEE, Las Vegas, NV, May 21-24, 1995, pp. 201-210.

Yip, W.Y., "Package Characterization of a 313 Pin BGA", *National Electronic Packaging and Production Conference West '95*, Reed Exhibition Companies, Feb. 26-Mar. 2, 1995, Anaheim, California, pp. 1530-1541.

Zamborsky, E., "BGAs in the Assembly Process", *Circuits Assembly*, Feb. 1995, vol. 6, No. 2, pp. 60, 62-64.

Zhao, Z., Ph.D., "IC Package Thermal Issues and Thermal Design," ASAT, Inc., Jan. 14, 2000, 98 pages, presented at $2^{nd}$ *International Icepak User's Group Meeting*, Palo Alto, CA, on Feb. 7, 2000.

Zhao, Z., Ph.D., "Thermal Design and Modeling of Packages," *IEEE Short Courses*, Broadcom Corporation, Oct. 25, 2000, 95 pages.

Zimerman, M., "High Performance BGA Molded Packages for MCM Application", *Surface Mount International Conference Proceedings*, Surface Mount International, Aug. 28-Sep. 1, 1994, San Jose, California, pp. 175-180.

Zweig, G., "BGAs: Inspect the Process, Not the Product", *Electronic Packaging & Producion (Special Supplement)*, Cahners Publishing Company, Aug. 1994 (Supplement), p. 41.

Freyman, B. and Petrucci, M., "High-Pincount PBGAs: Implementation Into Volume Manufacturing," *Advanced Packaging*, An IHS Group Publication, May/Jun. 1995, pp. 44-46.

English-language Abstract of FR 2803098, published Jun. 29, 2001, 1 page, printed from http://v3.espacenet.com.

English-language Summary of Decision of Rejection from Taiwanese Application No. 91108573, 5 pages.

Zhao et al., U.S. Appl. No. 10/284,340, filed Oct. 31, 2002, entitled "Ball Grid Array Package With Patterned Stiffener Layer," 137 pages.

\* cited by examiner

ENHANCED DIE-DOWN BALL GRID ARRAY AND METHOD FOR MAKING THE SAME

CROSS-REFERENCE TO OTHER APPLICATIONS

The following application of common assignee is related to the present application, and is herein incorporated by reference in its entirety:

"Enhanced Die-Up Ball Grid Array and Method for Making the Same," Ser. No. 09/742,366, filed Dec. 22, 2000.

BACKGROUND OF THE INVENTION

1. Field of the Invention

The invention relates generally to the field of integrated circuit (IC) device packaging technology, and more particularly to substrate stiffening and heat spreading techniques in ball grid array (BGA) packages.

2. Related Art

Integrated circuit (IC) dies are typically mounted in or on a package that is attached to a printed circuit board (PCB). One such type of IC die package is a ball grid array (BGA) package. BGA packages provide for smaller footprints than many other package solutions available today. A BGA package has an array of solder balls located on a bottom external surface of a package substrate. The solder balls are reflowed to attach the package to the PCB. The IC die is mounted to the package substrate. Wire bonds typically couple signals in the IC die to the substrate. The substrate has internal routing which electrically couples the IC die signals to the solder balls on the bottom substrate surface.

A number of BGA package substrate types exist, including ceramic, plastic, and tape (also known as "flex"). In some BGA package types, a heat spreader/stiffener may be attached to the substrate to provide heat sinking, and to supply planarity and rigidity to the package.

Die-up and die-down BGA package configurations exist. In die-up BGA packages, the IC die is mounted on a top surface of the substrate or heat spreader/stiffener, on a side opposite that of the solder balls. In die-down BGA packages, the IC die is mounted on a bottom surface of the substrate or stiffener, which is the same side as the solder balls.

The tape substrate used in flex BGA packages is typically polyimide, which has very low values of thermal conductivity. Consequently, the IC die is separated from the PCB by the tape substrate thermal barrier. The lack of direct thermal connection from IC die to PCB leads to relatively high resistance to heat transfer from IC die to printed circuit board (theta-jb).

Furthermore, conventional BGA packages are subject to high thermal stresses that result from the heat given off during operation of the mounted IC die. The thermal stresses are primarily imposed on the IC die due to a mismatch of the thermal expansion coefficient (CTE) between the semiconductor die and the stiffener/heat spreader. The thermal expansion coefficient (CTE) of copper typically used for a heat spreader in a tape BGA package is approximately $17.4 \times 10^{-6}/°$ C. For a silicon IC die, the CTE is approximately $2.64 \times 10^{-6}/°$ C. Because of the difference in CTE values, changes in temperature during the BGA package assembly process may lead to high levels of thermal stress. As the IC die size increases for a BGA package, higher stress levels will occur at the interface of the IC die and stiffener/heat spreader. Consequently, cracks often occur on large semiconductor IC dies during the portions of the assembly process following the attachment of the IC die to the stiffener/heat spreader.

Hence, what is needed are BGA packages with improved heat spreading capabilities. What is also needed is a reduction in BGA package thermal stress during the assembly process, to improve packaging yields.

SUMMARY OF THE INVENTION

The present invention is directed to an apparatus, system, and method for assembling a ball grid array (BGA) package. In one aspect, a stiffener/heat spreader is provided. A substrate has a first surface and a second surface. The substrate has a central window-shaped aperture that extends through the substrate from the first substrate surface to the second substrate surface. The first substrate surface is attached to a surface of the stiffener/heat spreader. A portion of the stiffener/heat spreader is accessible through the central window-shaped aperture. An IC die has a first surface and a second surface. The first IC die surface is mounted to the accessible portion of the stiffener/heat spreader. A drop-in heat spreader has a surface that is mounted to the second IC die surface.

Further embodiments, features, and advantages of the present inventions, as well as the structure and operation of the various embodiments of the present invention, are described in detail below with reference to the accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
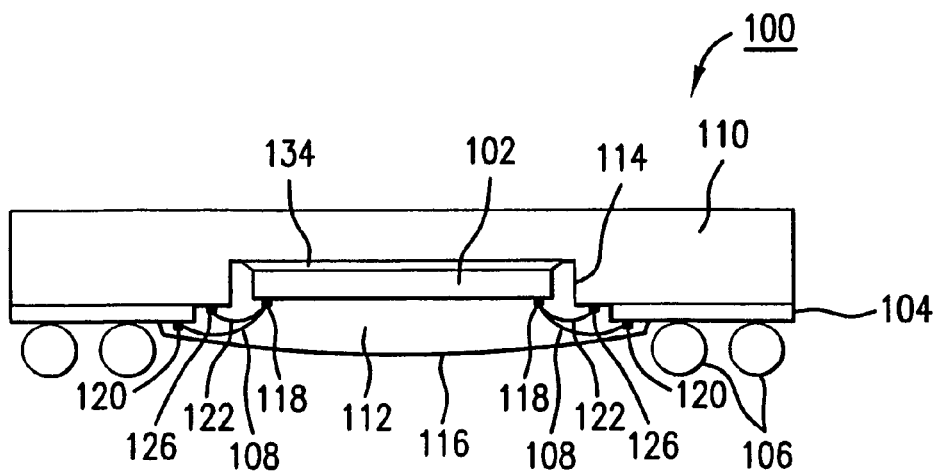
FIG. 1A illustrates an example die-down BGA package.

The present invention is described in the following with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

Overview

The present invention is directed to a method and system for improving the mechanical, thermal, and electrical performance of BGA packages. The present invention is applicable to all types of BGA substrates, including ceramic, plastic, and tape (flex) BGA packages. Furthermore the present invention is applicable to die-up (cavity-up) and die-down (cavity-down) orientations. Numerous embodiments of the present invention are presented herein.

Preferably, the invention is directed to heat sinking techniques in die-down BGA packaging. A top surface of an IC die is attached to a package stiffener/heat spreader in a die-down BGA package. A drop-in heat spreader is attached to a bottom surface of the IC die. By attaching the top and bottom surfaces of the IC die to heat spreaders, a symmetrical support structure surrounding the IC die is created. This support structure is substantially more symmetrical than the package heat spreader/IC die combination of conventional die-down BGA packages.

An advantage of the configuration of the present invention is a relief of, or a balancing of, stress that may bend an IC die in a conventional die-down BGA package. A conventional die-down BGA package may be considered to be similar to a "bi-metal" system. When temperature rises, the stiffener/heat spreader-to-IC die combination bends in a direction of the material with lower value of CTE; towards the IC die. When temperature is lowered, the heat spreader/IC die combination bends in a direction of the material with higher value of CTE; towards the heat spreader. The present invention described herein substantially forms a "tri-metal" system, with the IC die sandwiched between two heat spreaders. Preferably, the package stiffener/heat spreader is manufactured from the same material as the drop-in heat spreader. In such an arrangement, the package stiffener/heat spreader-to-IC die-to-drop-in heat spreader combination will not bend significantly with a change of temperature. This is because with temperature changes, both heat spreaders will bend towards or away from the IC die, essentially canceling each other's bending motion.

In a further embodiment, the drop-in heat spreader may be used as either a power plane or a ground plane for the die-down BGA package, to improve die-down BGA package electrical performance. IC die power or ground pads may be wire bound to a drop-in heat spreader attached to the center of the IC die. The drop-in heat spreader may be exposed at the bottom of the die-down BGA package encapsulation. The exposed surface of the drop-in heat spreader may be attached to the PCB. The drop-in heat spreader may be attached to a power or ground potential in the PCB. Such an arrangement may allow for the reduction of power/ground traces and power/ground solder balls, and may lead to shorter distance for supply and return current. These shorter distances may reduce undesired inductances.

Ball grid array package types are described below. Further detail on the above described embodiments, and additional embodiments according to the present invention, are presented below. The embodiments described herein may be combined in any applicable manner, as required by a particular application.

Ball Grid Array (BGA) Package

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but cover the entire bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., *Ball Grid Array Technology*, McGraw-Hill, N.Y., (1995), which is herein incorporated by reference in its entirety.

Die-up and die-down BGA package configurations exist. In die-up BGA packages, the IC die is mounted on a top surface of the substrate or stiffener, which is the side opposite that of the solder balls. In die-down BGA packages, the IC die is mounted on a bottom surface of the substrate or stiffener, which is the same side as the solder balls.

A number of BGA package substrate types exist, including ceramic, plastic (PBGA), and tape (also known as "flex"). FIG. 1A illustrates a tape BGA package 100. Tape BGA package 100 includes an IC die 102, a tape substrate 104, a plurality of solder balls 106, one or more wire bonds 108, a package stiffener/heat spreader 110, and one or more stiffener wire bonds 122. Tape or flex BGA packages are particularly appropriate for large IC dies with large numbers of input and outputs, such as application specific integrated circuits (ASIC) and microprocessors.

Tape substrate 104 is generally made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 104 may be a single-conductive-layer (single-layer) tape, a two-conductive-layer (two-layer) tape, or additional conductive layer tape substrate type. In a two-layer tape, the metal layers sandwich the dielectric layer, such as in a copper-Upilex-copper arrangement. Substrate 104 has a central window-shaped aperture 112 to accommodate IC die 102, as further described below.

Package stiffener/heat spreader 110 may be laminated to substrate 104. Stiffener 110 is typically made from a metal, or combination of metals, such as copper, tin, and aluminum, or may be made from a polymer, for example. Stiffener 110 also acts as a heat sink, and allows for heat spreading in BGA package 100. Stiffener 110 has a central cavity 114 on its bottom surface. Stiffener 110 may be configured in other ways than shown in FIG. 1A. For example, in other configurations, the bottom surface of stiffener 110 may not include a central cavity 114, and may instead be flat.

IC die 102 is attached directly to stiffener 110, for example, by an epoxy 134. IC die 102 is any type of semiconductor integrated circuit, which has been formed in, and separated from a semiconductor wafer.

One or more wire bonds 108 connect corresponding bond pads 118 on IC die 102 to contact points 120 on substrate 104. Bond pads 118 are coupled to signals internal to IC die 102, including logical signals, and power and ground potentials. Furthermore, one or more wire bonds 122 may connect corresponding bond pads 118 to contact stiffener points 126 on stiffener 110. For instance, stiffener 110 may be used as a power or ground plane.

An epoxy or encapsulant 116 covers IC die 102 and wire bonds 108 and 122 for mechanical and environmental protection.

As described above, BGA package 100 includes an array or plurality of solder balls 106 located on a bottom external surface of package substrate 104. IC die 102 is electrically connected to substrate 104 by one or more wire bonds 108. Wire bonds 108 are electrically connected to solder balls 106 on the bottom surface of substrate 104 through corresponding vias and routing in substrate 104. Vias in substrate 104 can be filled with a conductive material, such as solder, to allow for these connections. Solder balls 106 are attached to substrate 104, and are used to attach BGA package 100 to a PCB.

Note that although wire bonds, such as wire bonds 108, are shown and described herein, IC dies may be mounted and coupled to a substrate with solder balls located on a surface of the IC die, by a process commonly referred to as "C4" or "flip chip" packaging.

Figure 4:
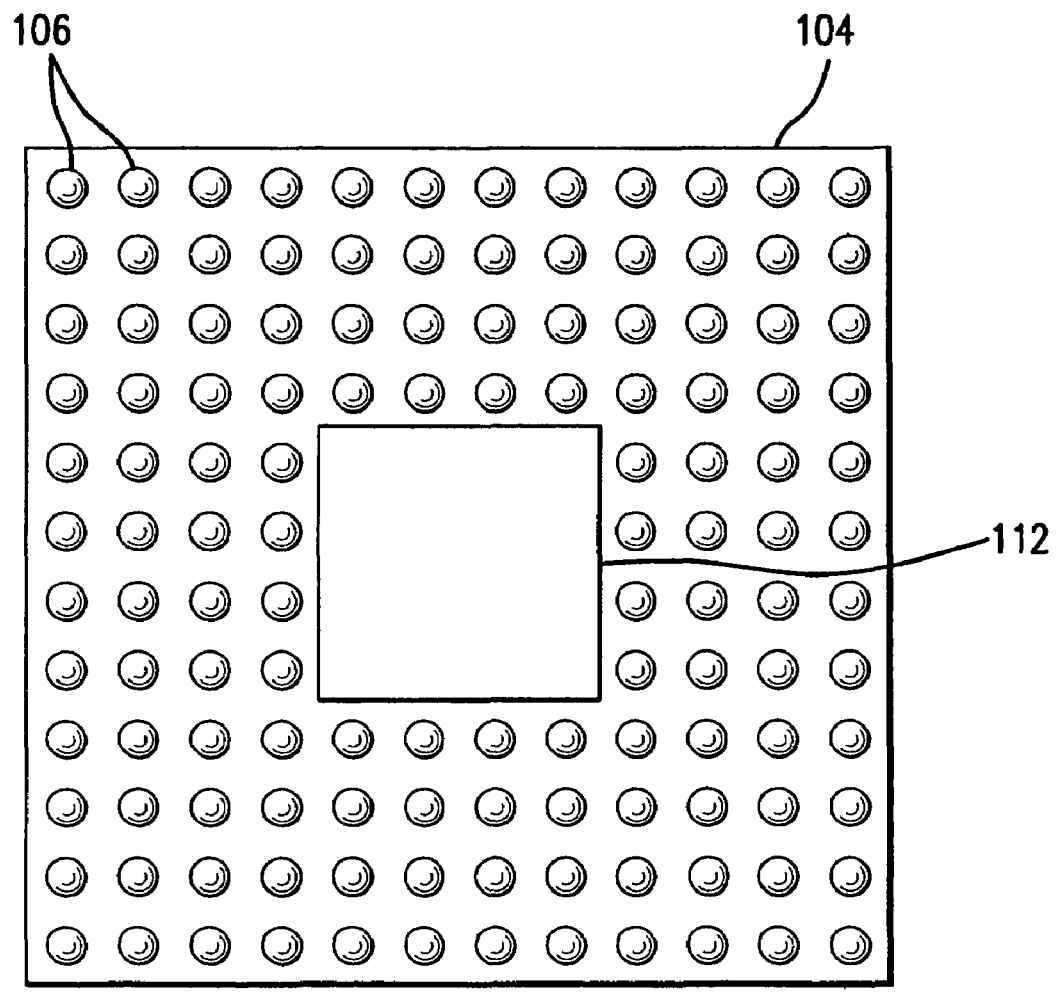
FIG. 4 illustrates a bottom view of an exemplary solder ball arrangement for a BGA package.

FIG. 4 illustrates a bottom view of an exemplary solder ball arrangement for BGA package 100. FIG. 4 shows a 12 by 12 array of solder balls on the bottom surface of substrate 104. Other sized arrays of solder balls are also applicable to the present invention. Solder balls 106 are reflowed to attach BGA package 100 to a PCB. The PCB may include contact pads to which solder balls 106 are bonded. PCB contact pads are generally made from a metal or combination of metals, such as copper, nickel, tin, and gold. The solder ball array may be organized in any number of ways, according to the requirements of the particular BGA package application.

Figure 5:
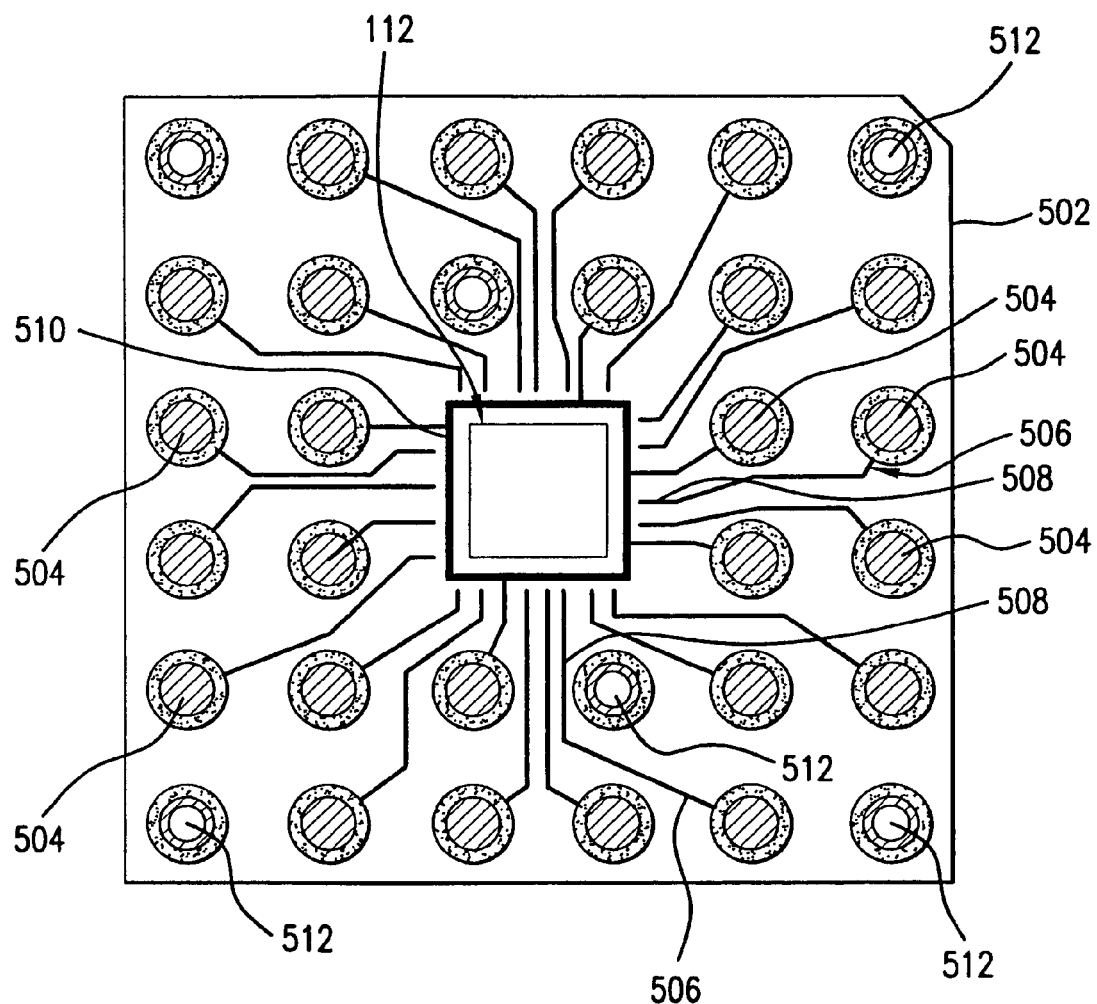
FIG. 5 shows an example layer of a substrate, with routing and vias.

As described above, the BGA package substrate provides vias and routing on one or more layers to connect contact pads for wire bonds to solder balls attached to the bottom substrate surface. FIG. 5 shows an example layer 502 of substrate 104, with routing and vias, for accomplishing this. A plurality of circular metal ball pads 504 are shown. Metal ball pads 504 may be patterned from a metal layer in substrate 104. As described above, substrate 104 includes central window-shaped aperture 112. Central window-shaped aperture 112 is preferably aligned, but larger than central cavity 114. A plurality of conductive metal traces 506 are shown coupled to metal ball pads 504, and ending in metal fingers 508 near the periphery of central window-shaped aperture 112. In some cases, metal traces 506 may be connected to a power ring 510. A plurality of vias 512 are also shown.

Figure 1B:
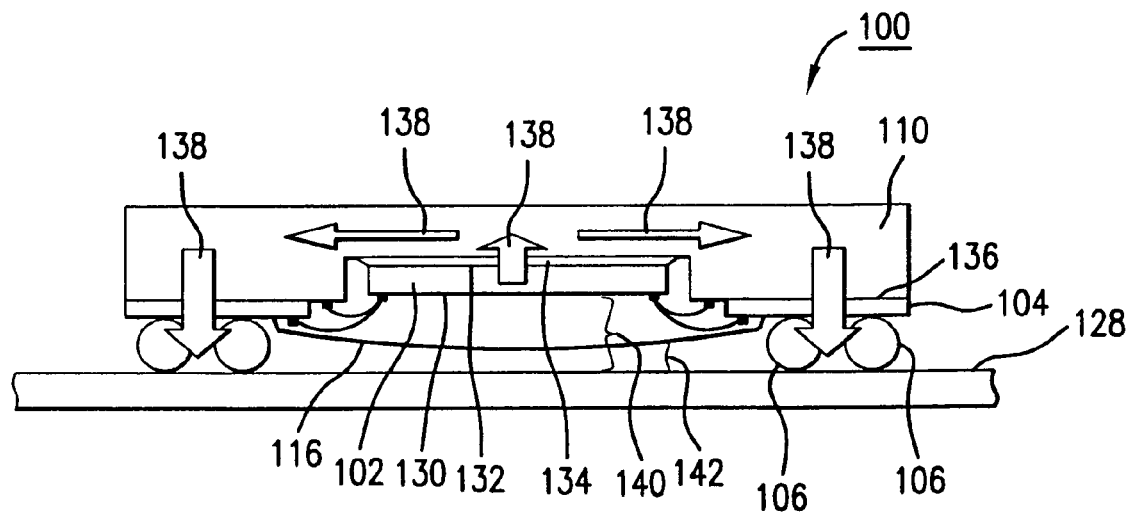
FIG. 1B illustrates a heat transfer path from an IC die to a PCB for the example die-down BGA package of FIG. 1A.

The present invention is applicable to improving thermal and electrical performance in the BGA package types described herein, and further BGA package types. FIG. 1B illustrates a heat transfer path from IC die 102 to a PCB 128 for BGA package 100. BGA package 100 provides a conductive thermal path from an active surface 130 of IC die 102, to a back surface 132 of IC die 102, to a die attach epoxy 134, to stiffener/heat spreader 110, to a tape attach epoxy 136, to substrate 104, to plurality of solder balls 106, to PCB 128. Arrows 138 show directions of heat flow from IC die 102 to PCB 128.

As shown in FIG. 1B, a zone 140 between IC die 102 and PCB 128 does not significantly contribute to heat transfer from IC die 102 to PCB 128, even though providing a relatively short distance between IC die 102 and PCB 128. The lack of heat transfer through zone 140 may be attributed to low conduction heat transfer coefficients of encapsulant 116 (the "glob top") and an air gap 142 between encapsulant 116 and PCB 128.

As shown in FIG. 1A, stiffener/heat spreader 110 may be used as a ground plane to reduce ground inductance. To further reduce inductance and resistance for power distribution, a separate power ring, such as power ring 510 shown in FIG. 5, must be constructed on substrate 104. Traces have to be added to the routing of substrate 104 to connect between the power ring and corresponding solder ball pads. A disadvantage of this configuration is an increased complexity in the design of substrate 104, and a reduced space for the routing of signal traces in substrate 104. Furthermore, power inductance increases with an increase in trace length in substrate 104.

BGA Package Drop-In Heat Spreader Embodiments According to the Present Invention Further details of structural and operational implementations of the present invention are described in the following sections. These structural and operational implementations are described herein for illustrative purposes, and are not limiting. The invention as described herein may be implemented in both die-up and die-down BGA package types, as well as in additional IC package types. Furthermore, each of the embodiments presented below are applicable to tape substrate BGA packages, as well as BGA packages with alternative substrate types, including BT, FR4, and ceramic, to name a few. One such package that may include aspects of the present invention is a die-up BGA package, developed by Broadcom Corp., which is located in Irvine, Calif. The description below is adaptable to these and other package types, as would be understood to persons skilled in the relevant art(s) from the teachings herein.

Features of each of the embodiments presented below may be incorporated into BGA packages independently, or may be combined in any manner in a BGA package, as would be apparent to persons skilled in the relevant art(s) from the teachings herein.

According to embodiments of the present invention, a heat spreader may be used in a BGA package to provide for thermal stress relief to the package, enhance dissipation of heat from the package, and improve package electrical performance. In a preferred embodiment, a drop-in heat spreader is attached to the bottom surface of an IC die in a die-down flex BGA package to provide one or more of these advantages.

Figure 2A:
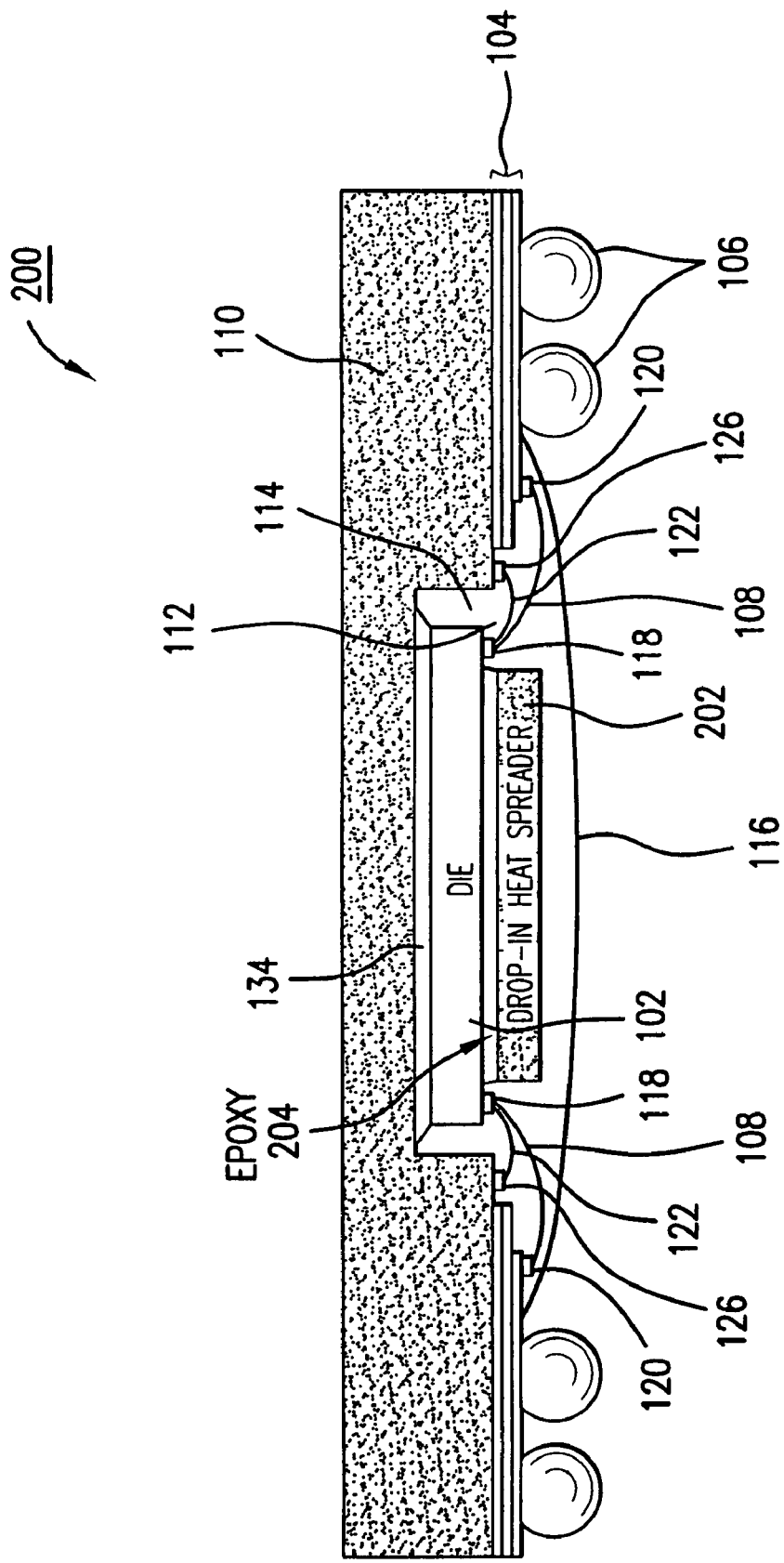
FIG. 2A illustrates a cross-sectional view of a BGA package, according to an embodiment of the present invention.

FIG. 2A illustrates a cross-sectional view of a die-down flex BGA package 200, according to an embodiment of the present invention. BGA package 200 includes IC die 102, substrate 104, plurality of solder balls 106, one or more wire bonds 108, package stiffener/heat spreader 110, encapsulant 116, one or more stiffener wire bonds 122, and a drop-in heat spreader 202. FIG. 2C illustrates a bottom view of die-down flex BGA package 200, according to an embodiment of the present invention. Encapsulant 116 is not shown in FIG. 2C.

Substrate 104 has a top surface to which a bottom surface of stiffener 110 is mounted. A bottom surface of substrate 104 attaches the plurality of solder balls 106. The plurality of solder balls 106 connect to vias and/or points on the bottom surface of substrate 104 to which signals internal to substrate 104 are routed and exposed. Substrate 104 includes central window-shaped aperture 112 that extends through substrate 104 from the top substrate surface to the bottom substrate surface.

A portion of stiffener/heat spreader 110 is accessible through central window-shaped aperture 112 of substrate 104. In an embodiment, central cavity 114 in stiffener 110 is accessible through window-shaped aperture 112. Central cavity 114 in stiffener 110 coincides with central window-shaped aperture 112 in substrate 104, to accommodate IC die 102. A top surface of IC die 102 is mounted in central cavity 114 of stiffener 110.

In an alternative embodiment, stiffener 110 does not have a central cavity 114, and has a bottom surface that is substantially planar. In an embodiment, a portion of the substantially planar bottom surface of stiffener 110 is accessible through window-shaped aperture 112. The top surface of IC die 102 is mounted to the accessible portion of the bottom surface of stiffener 110.

In an alternative embodiment, substrate 104 does not have a central window-shaped aperture 112, and is instead continuous. In such an embodiment, the top surface of IC die 102 is mounted to the bottom surface of substrate 104. Stiffener 110 may be coupled to IC die 102 through substrate 104 by one or more solder-filled vias, for instance, for thermal and/or electrical coupling.

One or more wire bonds 108 connect corresponding bond pads 118 on IC die 102 to contact points 120 on substrate 104.

In an embodiment, stiffener 110 is configured to operate as a ground or power plane. For example, one or more stiffener wire bonds 122 connect corresponding ground bond pads 118 to contact points 126 on stiffener 110. Stiffener 110 may be coupled to a ground signal in the PCB through one or more solder balls 106 and vias and/or routing in substrate 104.

As shown in FIG. 2A, a surface of drop-in heat spreader 202 is attached to the top surface (active surface) of IC die 102 using an epoxy 204 or similar substance. Epoxy 204 may be the same substance as encapsulant 116, the same material as epoxy 134, or may be a different substance. Silver filled epoxies may be used for epoxy 204 to enhance heat extraction from IC die 102. Encapsulant 116 may be used for attachment of the drop-in heat spreader to IC die 102. In an embodiment, when encapsulant 116 is used to attach the drop-in heat spreader, the heat spreader is placed on the active surface of the IC die surface before application of the encapsulant.

Figure 2B:
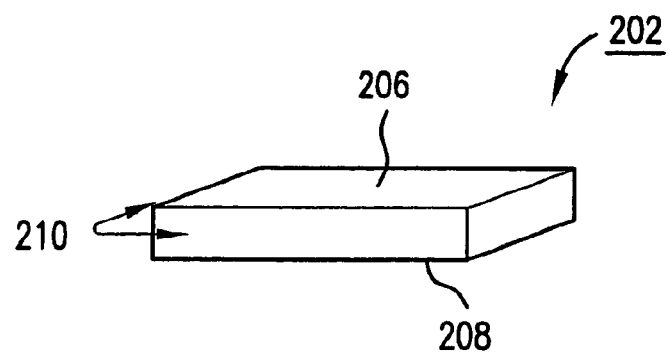
FIG. 2B shows a perspective view of an example drop-in heat spreader, according to an embodiment of the present invention.
Figure 2C:
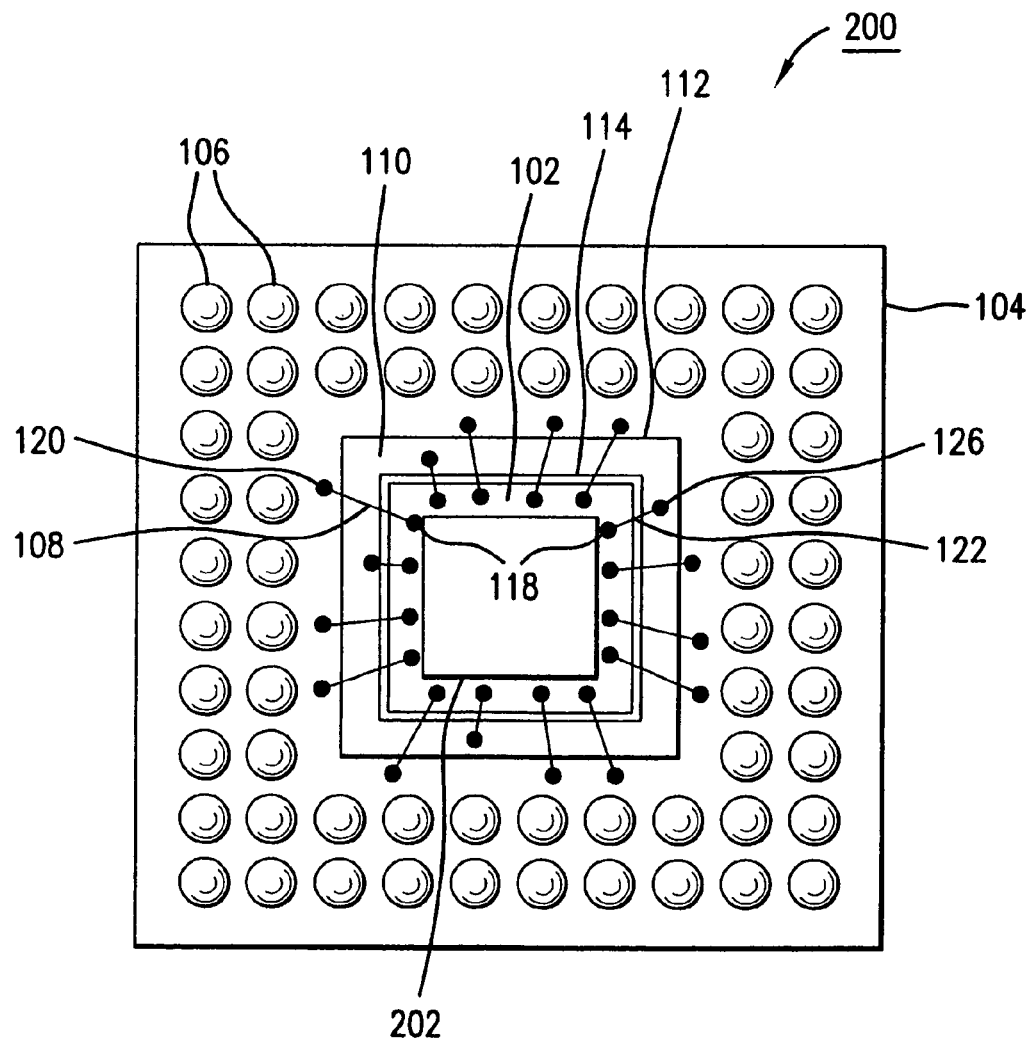
FIG. 2C illustrates a bottom view of the BGA package of FIG. 2A, according to an embodiment of the present invention.

FIG. 2B shows a perspective view of an example heat spreader 202, according to an embodiment of the present invention. Top surface 206 and bottom surface 208 of heat spreader 202 shown in FIG. 2B are substantially rectangular in shape. Heat spreader 202 includes a circumferential surface 210 that extends around heat spreader 202 between top surface 206 and bottom surface 208. Heat spreader 202 may be configured in other shapes, such as where top surface 206 and bottom surface 208 of heat spreader 202 are elliptical or round, and other shapes.

The material used for drop-in heat spreader 202 may be one or more metals such as copper or aluminum, for example. Heat spreader 202 may be machined, molded, or otherwise manufactured from these materials. Heat spreader 202 may be made from the same material as stiffener/heat spreader 110. In such an embodiment, stiffener/heat spreader 110 and drop-in heat spreader 202 would have the same thermal expansion coefficient. In such a configuration, the combination of stiffener/heat spreader 110, IC die 102, and drop-in heat spreader 202 will not bend significantly with a change of temperature. As temperature changes, both stiffener 110 and heat spreader 202 will bend towards or away from IC die 102, substantially canceling each other's bend.

In an embodiment, heat spreader 202 is configured to operate as a ground plane or power plane. For example, one or more ground or power wire bonds may be used to connect bond pads on IC die 102 to contact points on heat spreader 202. When bottom surface 208 of heat spreader 202 is exposed after connection to IC die 102, bottom surface 208 can be attached to a PCB using solder, conductive epoxy, or other substances. The PCB connection area is connected to a PCB power or ground plane. Such a configuration may reduce or eliminate power or ground traces on substrate 104, and reduce the number of solder balls attached to substrate 104 that are dedicated to power or ground. This configuration may also lead to shorter current travel lengths, and may reduce inductance and resistance related to BGA package 200. Furthermore, a portion of circumferential surface 210 may also be exposed when bottom surface 208 is exposed.

Figure 3A:
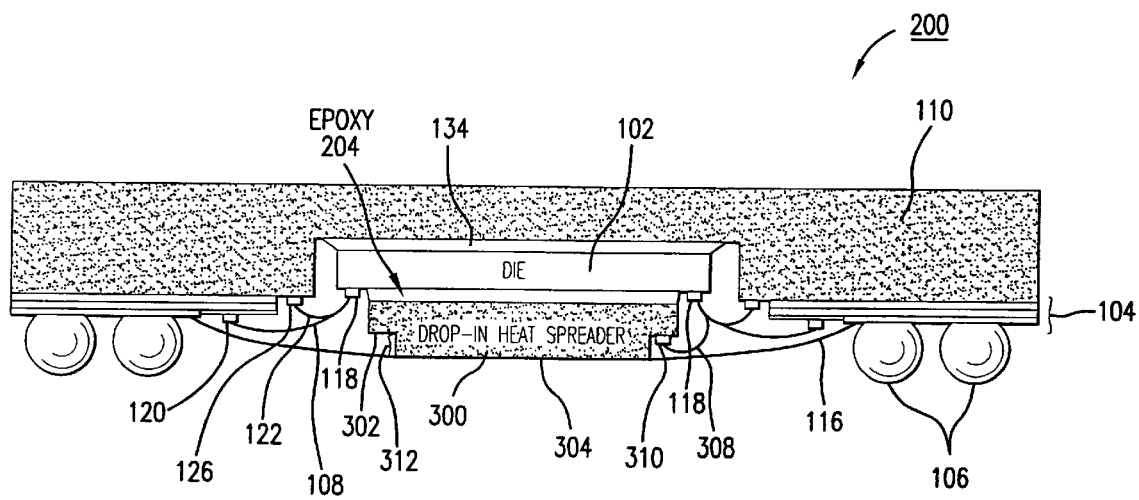
FIG. 3A illustrates a cross-sectional view of a BGA package that includes an exemplary drop-in heat spreader, according to an embodiment of the present invention.
Figure 3B:
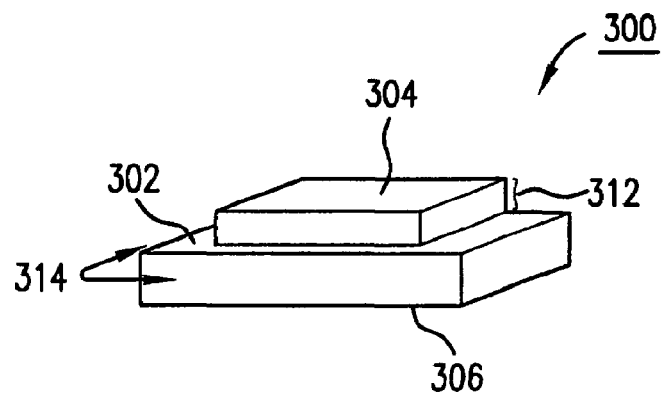
FIG. 3B shows a perspective view of the drop-in heat spreader shown in FIG. 3A, according to an embodiment of the present invention.

A drop-in heat spreader may be shaped to provide for easier connection of power or ground wire bonds to the drop-in heat spreader. Furthermore, a portion of the drop-in heat spreader may also protrude through encapsulant 116 for thermal and electrical connection with the PCB. FIG. 3B shows a perspective view of a drop-in heat spreader 300, according to an embodiment of the present invention. Heat spreader 300 includes a ridge 302. FIG. 3A illustrates a cross-sectional view of BGA package 200 that includes heat spreader 300, according to an embodiment of the present invention. As shown in FIG. 3B, a first surface 304 and second surface 306 of drop-in heat spreader 202 are substantially planar and substantially parallel to each other. A circumferential surface 314 extends around heat spreader 300 between first surface 304 and second surface 306. Ridge 302 extends around at least a portion of the circumference of heat spreader 202, such that an area of surface 306 is greater than that of an area of surface 304. A pedestal 312 of heat spreader 300 is formed by a portion of circumferential surface 314 of heat spreader 300 between ridge 302 and first surface 304.

Figure 3C:
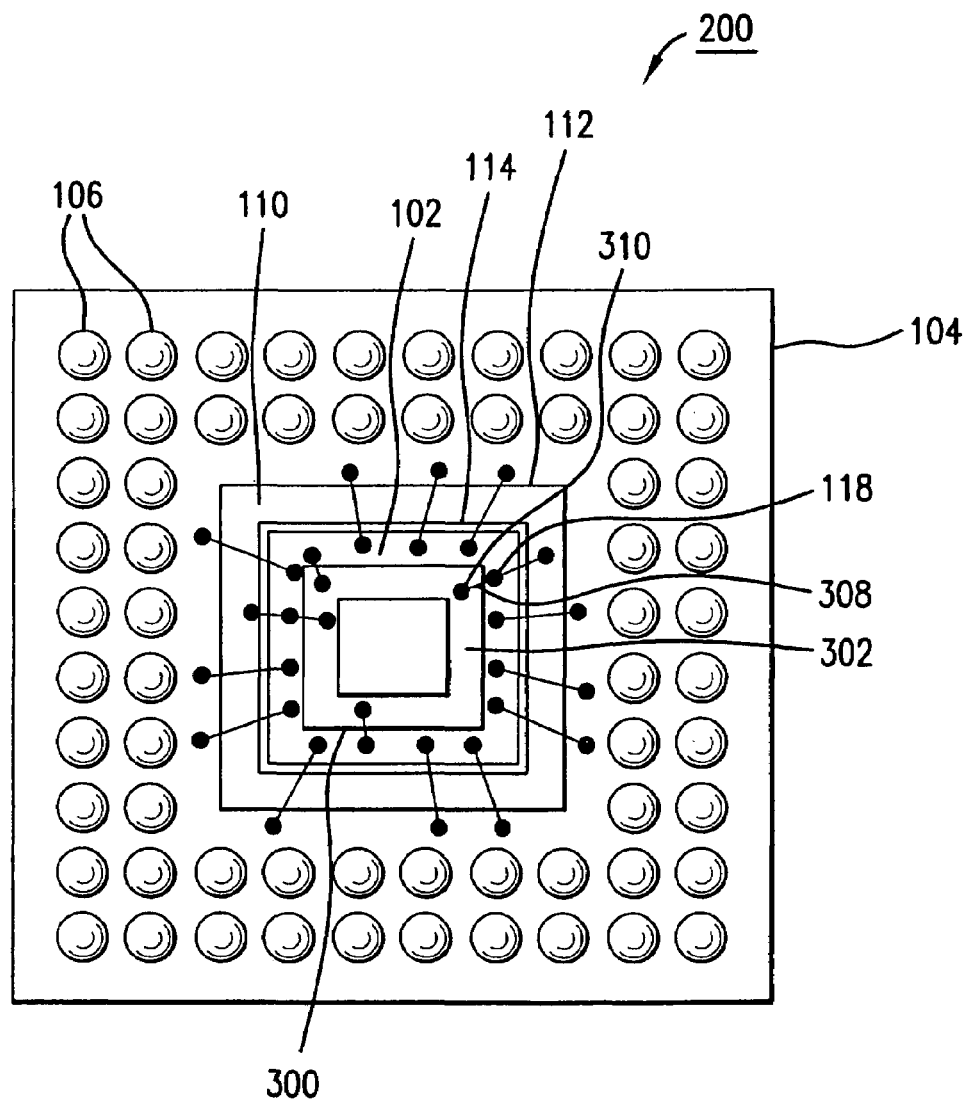
FIG. 3C illustrate a bottom view of the BGA package of FIG. 3A, with wire bonds from an IC die to a drop-in heat spreader, according to an embodiment of the present invention.

Ridge 302 provides a convenient connection point for wire bonds. FIG. 3C illustrates a bottom view of BGA package 200, with wire bonds from IC die 102 to heat spreader 300, according to an embodiment of the present invention. For example, one or more ground wire bonds 308 connect corresponding ground bond pads 118 on IC die 102 to contact points 310 on heat spreader 300. As shown in FIG. 3A, contact points 310 may be located on ridge 302 of heat spreader 300.

As shown in FIGS. 2A and 3A, heat spreaders 202 and 300 may be smaller in area than the bottom surface of IC die 102. Alternative sizes for heat spreaders 202 and 300 are also applicable to the present invention, including sizes equal to the area of IC die 102, or larger areas. Heat spreaders 202 and 300 are shaped and configured to spread heat from IC die 102, as is required by the particular application. For example, by maximizing the size of heat spreader 202 and 300, such that edges of heat spreaders 202 and 300 are close to wire bond pads on IC die 102, self-inductance due to a reduced wire bond length may be minimized.

Figure 3D:
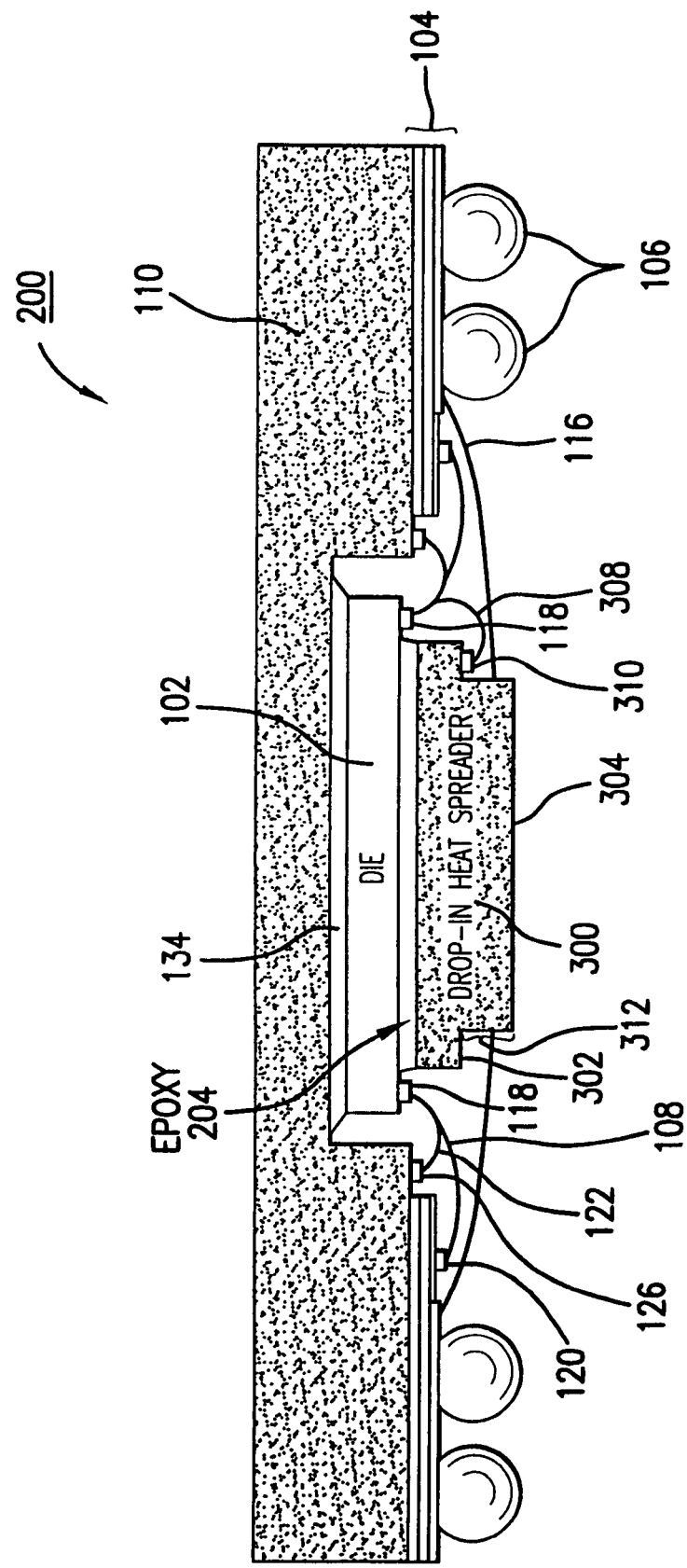
FIG. 3D illustrates a cross-sectional view of BGA package that includes an exemplary drop-in heat spreader with a portion protruding through an encapsulant, according to an embodiment of the present invention

An encapsulant may be used to encapsulate the IC die and at least a portion of the drop-in heat spreader. In FIG. 2A, IC die 102 and drop-in heat spreader 202 are completely encapsulated by encapsulant 116. In an alternative embodiment, such as shown in FIG. 3A, a portion of drop-in heat spreader 300 (surface 304) is exposed through encapsulant 116. A portion of the circumferential surface of heat spreader 300 between surface 304 and surface 306 may also be exposed through encapsulant 116. For example, all or a portion of pedestal 312 may protrude through encapsulant 116, as shown in FIG. 3D. As described above, when exposed, the exposed surface of the drop-in heat spreader may be configured to be attached to a PCB. For instance, the exposed surface may be plated with solder. By exposing a surface of the drop-in heat spreader for attachment to a PCB, a greater transfer of heat from the BGA package may be obtained.

By attaching drop-in heat spreader 202 or 300 to the top surface of IC die 102, the mechanical structure of BGA package 200 becomes more symmetrical in its center region. Thermal stress at the interface of IC die 102 and stiffener 110 is substantially released or altered by the drop-in heat spreader. Deformation caused by thermal stress is substantially reduced through the use of a drop-in heat spreader, such as heat spreader 202 or 300. Drop-in heat spreaders 202 and 300 allow for even larger sizes of IC die 102 and greater I/O counts by providing for greater heat spreading capacity in BGA package 200.

Figure 6:
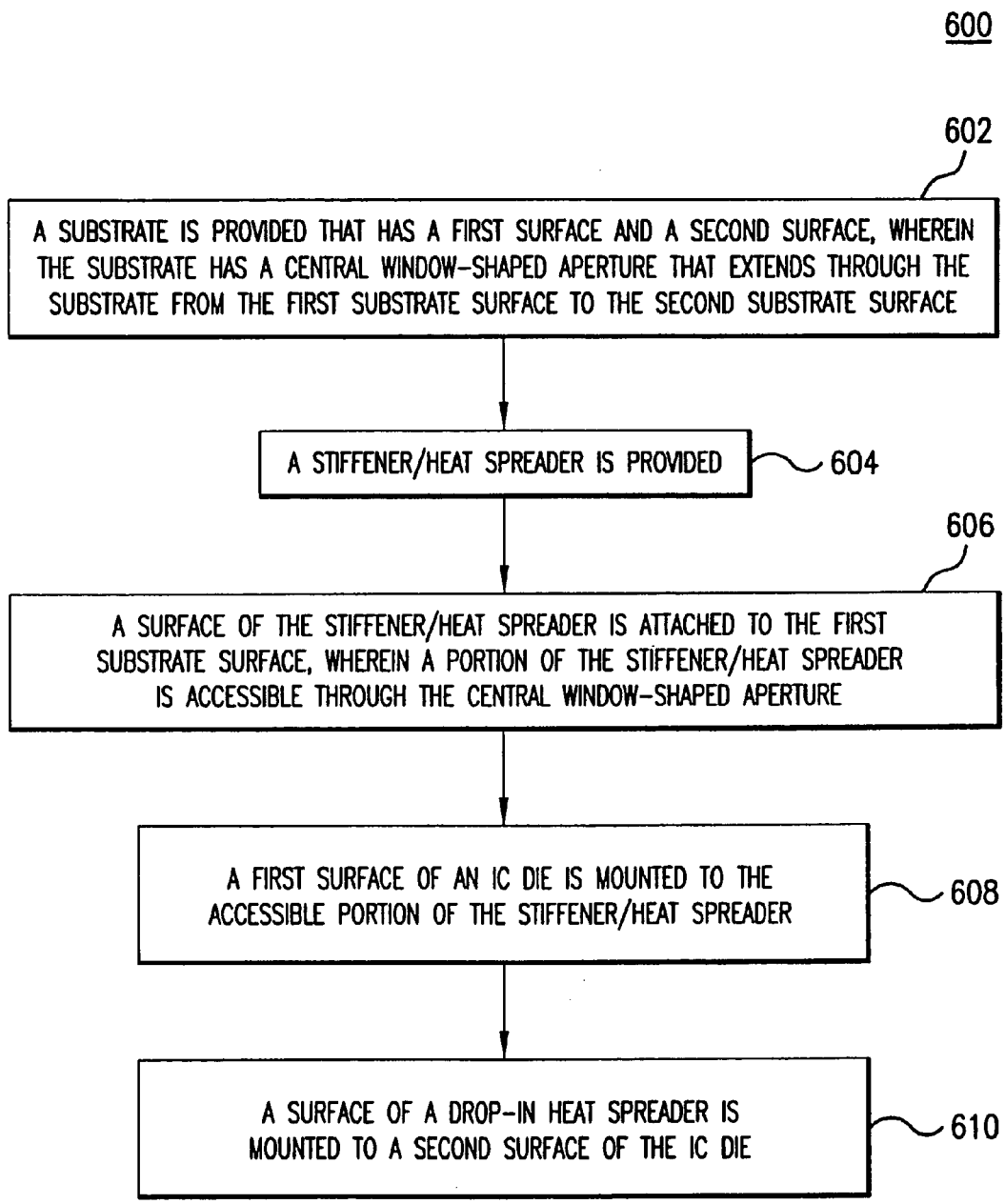
FIG. 6 shows a flowchart providing operational steps for assembling one or more embodiments of the present invention.

FIG. 6 shows a flowchart 600 providing operational steps for assembling one or more embodiments of the present invention. For example, the steps of flowchart may be used to assemble BGA package 200. The steps of FIG. 6 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 600 begins with step 602. In step 602, a substrate is provided that has a first surface and a second surface, wherein the substrate has a central window-shaped aperture that extends through the substrate from the first substrate surface to the second substrate surface. For example, the substrate is tape substrate 104, or another substrate type suitable for a BGA package. The central window-shaped aperture is window-shaped aperture 112.

In step 604, a stiffener/heat spreader is provided. For example, the stiffener is stiffener/heat spreader 110.

In step 606, a surface of the stiffener/heat spreader is attached to the first substrate surface, wherein a portion of the stiffener/heat spreader is accessible through the central window-shaped aperture. For example, a surface of stiffener 110 is attached to a surface of substrate 104. In an alternative embodiment, substrate 104 does not have a central window-shaped aperture, but is continuous.

In step 608, a first surface of an IC die is mounted to the accessible portion of the stiffener/heat spreader. For example, the IC die is IC die 102, which is mounted to stiffener 110. In an alternative embodiment, when substrate 104 is continuous, the first surface of IC die 102 is mounted to substrate 104.

In step 610, a surface of a drop-in heat spreader is mounted to a second surface of the IC die. For example, the drop-in heat spreader may be heat spreader 202 or 300, which is mounted with epoxy 204 or other attachment means to the bottom surface of IC die 102. Heat spreader 202 or 300 typically is mounted to the center of the bottom surface of IC die 102, and covers less than the entire bottom surface of IC die 102. For instance, the smaller area of heat spreader 202 or 300 allows for bond pads 118 to be exposed on the bottom surface of IC die 102 for wire bond connections. In alternative embodiments, heat spreader 202 or 300 is of the same size, or comprises a larger area than the upper surface of IC die 102.

A benefit of performing the steps of flowchart 600 is that the heat spreader relieves thermal stress at an interface of the IC die and the first stiffener surface. Further benefits may include an enhancement of heat dissipation from the BGA package, and an improvement in BGA package electrical performance.

In an embodiment, flowchart 600 comprises the additional step where a plurality of solder balls are attached to the second substrate surface. For example, the plurality of solder balls are plurality of solder balls 106, which connect to vias and/or solder ball pads on the bottom surface of substrate 104. The solder balls may be arranged on the bottom surface of substrate 104 as shown in FIG. 4, for example, or in alternative arrangements. The solder balls are used to attach a BGA package to a PCB.

In an embodiment, the second IC die surface includes a contact pad. For example, the contact pad may be contact pad 118. Flowchart 600 may further comprise the step where the contact pad is coupled to the drop-in heat spreader with a wire bond. For example, the wire bond may be wire bond 108, 122, or 308. In an embodiment, the contact pad is a ground contact pad. Flowchart 600 may comprise the additional step where the ground contact pad is coupled to the drop-in heat spreader with the wire bond, wherein the drop-in heat spreader operates as a ground plane.

In an embodiment, step 610 comprises the step where a drop-in heat spreader is provided that has a first planar surface, wherein said drop-in heat spreader has a second planar surface, wherein said first and said second planar surfaces are substantially parallel to each other, wherein said drop-in heat spreader has a ridge around at least a portion of its circumference such that an area of said first planar surface is greater than that of said second planar surface. For example, the ridge is ridge 302. In an embodiment, flowchart 600 comprises the additional step where the wire bond is attached to the ridge of the drop-in heat spreader. For example, the wire bond is wire bond 308.

In an embodiment, flowchart 600 comprises the additional step where a second surface of the drop-in heat spreader is configured to be attached to a printed circuit board. For example, the bottom surface of the heat spreader is exposed, and may be plated with solder.

In an embodiment, flowchart 600 comprises the additional step where a central cavity is formed in the stiffener/heat spreader surface, wherein the central cavity forms at least a portion of the accessible portion of the stiffener/heat spreader. For example, the central cavity is central cavity 114. In an embodiment, step 608 comprises the step where the IC die is mounted in the central cavity.

In an embodiment, step 610 comprises the step where a drop-in heat spreader is provided that is substantially planar, wherein the accessible portion of the stiffener/heat spreader is centrally located on the substantially planar stiffener/heat spreader surface.

In an embodiment, step 608 comprises the step where the IC die first surface is mounted to the stiffener/heat spreader with a first epoxy, wherein the drop-in heat spreader is mounted to the IC die with a second epoxy. For example, the first epoxy is epoxy 134, and the second epoxy is epoxy 204.

In an embodiment, an area of the second IC die surface is greater than an area of a surface of the drop-in heat spreader. Flowchart 600 may include the additional step where the drop-in heat spreader is configured to mount to the center of the second IC die surface.

In an embodiment, flowchart 600 comprises the additional step where the IC die and the drop-in heat spreader are encapsulated. For instance, IC die 102, heat spreader 202 or 300, and wire bond 108 are encapsulated by a molding compound or epoxy, shown as encapsulant 116. In a first embodiment, the IC die and the drop-in heat spreader are encapsulated where neither are exposed, as shown in FIG. 2A, for example. In a second embodiment, a surface of the drop-in heat spreader is exposed, as shown in FIG. 3A, for example. In a third embodiment, a portion of circumferential surface of the drop-in heat spreader is exposed and protrudes through the bottom surface of encapsulant 116, as shown in FIG. 3D, for example.

In an embodiment, step 602 comprises the step where a tape substrate is provided. For example, substrate 104 may be a tape substrate.

In an embodiment, flowchart 600 comprises the additional step where a thermal expansion coefficient of the stiffener/ heat spreader is matched to the thermal expansion coefficient of the drop-in heat spreader. For example, stiffener 110 and heat spreader 202 or 300 are constructed from the same material, such that their thermal expansion coefficients are substantially matched.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A ball grid array (BGA) package, comprising:
   a first heat spreader;
   a substrate having an opening that extends through said substrate, wherein said substrate is attached to a surface of said first heat spreader;
   an IC die having opposing first and second surfaces, wherein said first surface of said IC die is mounted to said first heat spreader through said opening, wherein said second surface of said IC die includes a contact pad;
   a second heat spreader having opposing first and second surfaces, said first surface of said second heat spreader mounted to said second surface of said IC die; and
   a wire bond having a first end and a second end, the first end being attached to said contact pad of said IC die, the second end being directly attached to said second surface of said second heat spreader.

2. The package of claim 1, further comprising:
   a plurality of solder balls attached to a surface of said substrate.

3. The package of claim 1, wherein said second heat spreader is configured to dissipate heat generated by said IC die.

4. The package of claim 1, wherein said second heat spreader is configured to be attached to a printed circuit board.

5. The package of claim 1, wherein said contact pad is a ground contact pad, and wherein said second heat spreader operates as a ground plane.

6. The package of claim 1, wherein said first heat spreader includes a central cavity in said surface of said first heat spreader, wherein said IC die is mounted in said central cavity.

7. The package of claim 1, wherein said surface of said first heat spreader is substantially planar.

8. The package of claim 1, wherein said IC die is mounted to said surface of said first heat spreader with a first epoxy layer, and wherein said second heat spreader is mounted to said IC die with a second epoxy layer.

9. The package of claim 1, wherein an area of said IC die is greater than an area of said first surface of said second heat spreader.

10. The package of claim 1, wherein said IC die and said second heat spreader are encapsulated.

11. The package of claim 1, wherein said IC die and a portion of said second heat spreader are encapsulated by an encapsulant material, wherein said second surface of said second heat spreader is not encapsulated by said encapsulant material.

12. The package of claim 11, wherein said second heat spreader includes a circumferential surface between said first and said second surfaces of said second heat spreader, wherein said circumferential surface is at least partially not covered by said encapsulant material.

13. The package of claim 1, wherein said substrate is a tape substrate.

14. The package of claim 1, wherein said first heat spreader and said second heat spreader have a same thermal expansion coefficient.

15. The package of claim 1, wherein said second heat spreader has a ridge between said first surface and said second surface of said second heat spreader.

16. The package of claim 15, wherein said ridge extends around a portion of a circumference of said second heat spreader.

17. The package of claim 15, wherein said ridge extends around said second heat spreader.

18. The package of claim 15, wherein said second heat spreader includes:
    a circumferential surface around said second heat spreader that connects said first and said second surfaces of said second heat spreader; and
    wherein said ridge is opposed to said second surface of said second heat spreader in said circumferential surface.

19. The package of claim 1, wherein said second heat spreader comprises at least one metal.

20. The package of claim 19, wherein said at least one metal includes copper.

21. The package of claim 19, wherein said at least one metal includes aluminum.

22. The package of claim 1, wherein said second heat spreader is electrically conductive.

23. The package of claim 1, further comprising:
    an encapsulant material that encapsulates said IC die and said second heat spreader on said surface of said first heat spreader.

24. The package of claim 23, wherein said encapsulant material is used to maintain said second heat spreader in contact with said IC die.

25. The package of claim 1, further comprising:
    a thermally conductive adhesive material that attaches said first surface of said second heat spreader to said IC die.

26. The package of claim 1, further comprising:
    an electrically conductive adhesive material that attaches said first surface of said second heat spreader to said IC die.

27. The package of claim 1, wherein said second heat spreader is substantially rectangular in shape.

28. A ball grid array (BGA) package, comprising:
    a first heat spreader;
    a substrate having an opening that extends through said substrate, wherein said substrate is attached to a surface of said first heat spreader;
    an IC die mounted to said first heat spreader through said opening;
    a second heat spreader mounted to said IC die, said second heat spreader has opposing first and second surfaces; and
    a wire bond having a first end and a second end, the first end being attached to a contact pad of said IC die, the second end being attached to said second heat spreader;
    wherein said second heat spreader has a ridge between said first surface and said second surface of said second heat spreader, and wherein said wire bond attaches to said ridge of said second heat spreader.

29. A ball grid array (IBGA) package, comprising:

a first heat spreader;

a substrate having an opening that extends through said substrate, wherein said substrate is attached to said first heat spreader;

an IC die mounted to said first heat spreader through said opening; and a second heat spreader having a first surface, a second surface, and a ridge surface that at least partially surrounds said second surface, wherein said second and said ridge surfaces are opposed to said first surface;

wherein said first surface of said second heat spreader is mounted to said IC die, wherein said second surface of said second heat spreader is configured to be attached to a printed circuit board.

30. The package of claim 29, further comprising:

an encapsulating material that encapsulates said IC die and a portion of said second heat spreader.

31. The package of claim 30, wherein a surface of said encapsulating material is co-planar with said ridge surface.

32. The package of claim 30, wherein a surface of said encapsulating material is co-planar with said second surface of said second heat spreader.

33. The package of claim 29, further comprising:

at least one wire bond that couples at least one contact pad of said IC die to said second heat spreader.

34. The package of claim 29, wherein said substrate has opposing first and second surfaces, where the first surface of said substrate is attached to said first heat spreader, said substrate having a plurality of solder ball pads formed on said second surface of the substrate.

* * * * *